United States Patent [19]

Ueno et al.

[11] Patent Number: 5,659,497

[45] Date of Patent: Aug. 19, 1997

[54] SIGNAL PROCESSING APPARATUS FOR PROCESSING A PLURALITY OF INDIVIDUAL SIGNALS

[75] Inventors: Isamu Ueno, Hadano; Mamoru Miyawaki, Isehara, both of Japan

[73] Assignee: Canon Kabushiki Kaisha, Tokyo, Japan

[21] Appl. No.: 757,231

[22] Filed: Nov. 27, 1996

Related U.S. Application Data

[63] Continuation of Ser. No. 251,583, May 31, 1994, abandoned.

[30] Foreign Application Priority Data

Jun. 2, 1993 [JP] Japan ................ 5-132010

[51] Int. Cl.$^6$ .................................. H03K 5/08

[52] U.S. Cl. ............... 365/149; 365/189.09; 327/95; 327/96

[58] Field of Search .................. 365/149, 189.09; 327/94, 95, 96, 126, 128, 127, 335, 336, 345

[56] References Cited

U.S. PATENT DOCUMENTS

| | | | |
|---|---|---|---|
| 4,308,468 | 12/1981 | Olson | 327/94 |
| 4,531,095 | 7/1985 | Ishigaki et al. | 327/94 |
| 4,886,986 | 12/1989 | Watanabe | 327/94 |
| 4,922,120 | 5/1990 | Swerlein | 327/94 |
| 5,506,525 | 4/1996 | Debroux | 327/94 |

FOREIGN PATENT DOCUMENTS

| | | |
|---|---|---|
| 0205201 | 12/1986 | European Pat. Off. . |
| 345003459 | 1/1979 | Japan . |
| 9111812 | 8/1991 | WIPO . |

OTHER PUBLICATIONS

Patent Abstracts of Japan No. JP59096599, published Sep. 29, 1984, vol. 8, No. 214 (P-304) (Sanyo Denki KK).

Patent Abstracts of Japan No. JP63311700, published Apr. 13, 1989, vol. 13, No. 152 (P-856) (Matsushita Electric Ind).

*Primary Examiner*—David C. Nelms
*Assistant Examiner*—Vu A. Le
*Attorney, Agent, or Firm*—Robin, Blecker, Daley & Driscoll

[57] ABSTRACT

A signal processing apparatus comprising a signal holding circuit to hold an input signal from a signal source, a coupling capacitor provided on the signal source side, a connecting circuit to selectively connect the coupling capacitor and the signal holding circuit, and an adding circuit to add the input signal from the signal source on the basis of the signal held in the signal holding circuit. The adding circuit includes a buffer circuit and a switch to selectively connect the buffer circuit and the output side of the coupling capacitor.

37 Claims, 15 Drawing Sheets

SIGNAL PROCESSING APPARATUS FOR PROCESSING A PLURALITY OF INDIVIDUAL SIGNALS

This is a continuation application under 37 CFR 1.62 of prior application Ser. No. 08/251,583 filed May 31, 1994 abandoned.

BACKGROUND OF THE INVENTION

1. Field of the Invention

The invention relates to a signal processing apparatus for processing a plurality of individual signals which are used in a memory device, a photoelectric converting apparatus, or the like.

2. Related Background Art

In a semiconductor memory device represented by a read only memory (ROM) or an image sensor, there is used a construction such that output signals from signal sources such as memory cells or photo cells are time-sequentially output to the output port by using shift registers on the basis of an XY address method by the vertical and horizontal scans.

As disclosed in Japanese Patent Laid-Open Application No. 63-86679, as one of conventional techniques, a signal process such as to add a plurality of signals is executed by a photoelectric converting apparatus or the like.

However, at the stage of processing the signals, further improvement us required with respect to the enlargement of a dynamic range or the increase in S/N ratio.

SUMMARY OF THE INVENTION

It is an object of the invention to solve the above technical subject and to provide a signal processing apparatus which has a large dynamic range and which can execute signal processes at a high S/N ratio.

According to an embodiment of the invention, the above object is accomplished by a signal processing apparatus comprising: signal holding means for holding an input signal from a signal source; a coupling capacitor provided on the signal source side; connecting means for selectively connecting the coupling capacitor and the signal holding means; and adding means for adding the input signal from the signal source onto the signal held in the signal holding means.

According to the embodiment of the invention, since only the signal components can be substantially added so as to cancel the noise components, the dynamic range is widened and the adding process having an excellent S/N ratio can be executed.

The above and other objects and features of the present invention will become apparent from the following detailed description and the appended claims with reference to the accompanying drawings.

DETAILED DESCRIPTION OF THE PREFERRED EMBODIMENTS

Figure 1:
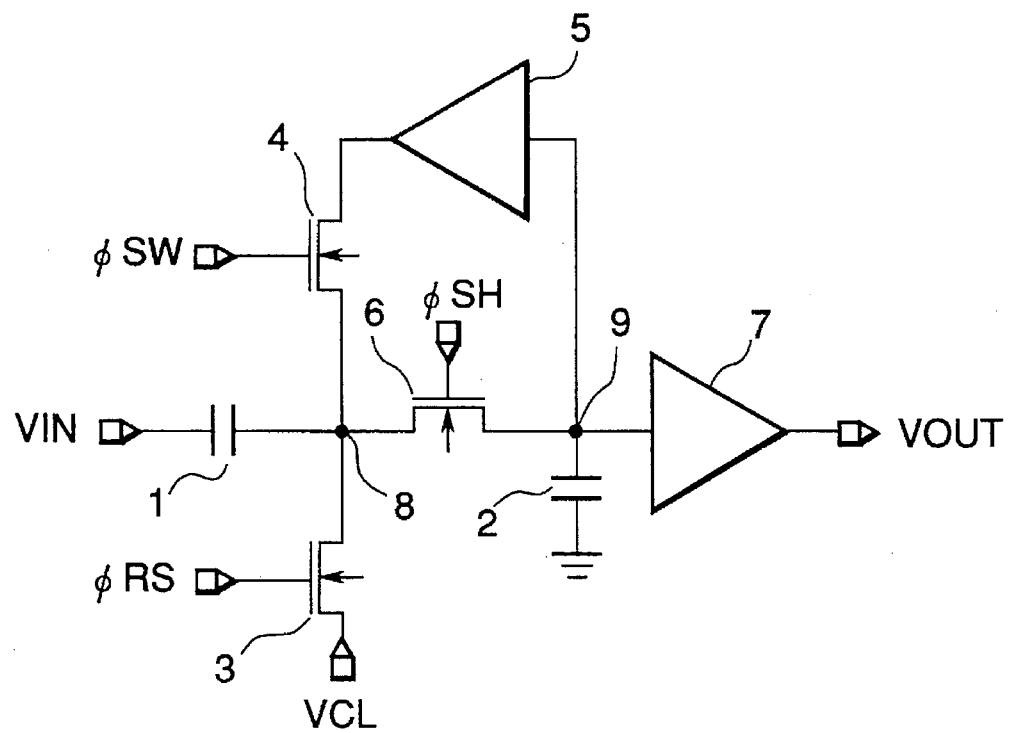
FIG. 1 is a circuit constructional diagram of a signal processing apparatus according to an embodiment 1 of the invention.
Figure 2:
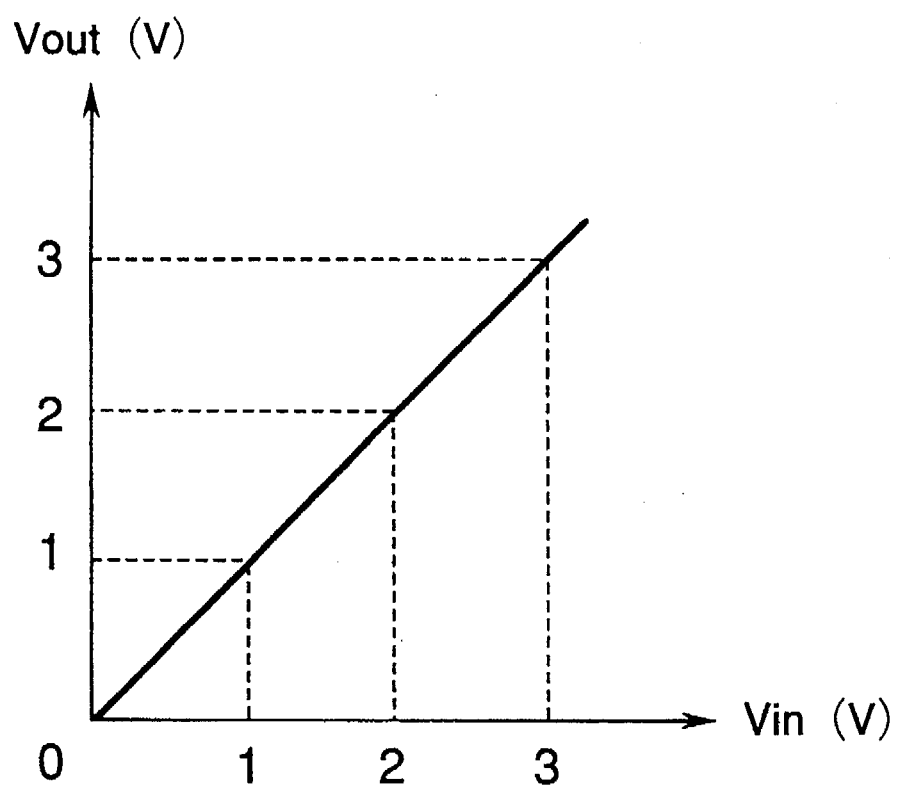
FIG. 2 is a graph showing characteristics of a buffer circuit which is used in the invention.

FIG. 1 shows the first embodiment of the invention. The embodiment comprises: capacitor means 1 as a coupling capacitor to take out an AC signal component of an input signal from an input terminal $V_{IN}$; resetting means 3; sampling means 6 serving as connecting means; holding means 2 serving as signal holding means; buffer means 5 and 7; and switching means 4. The buffer means 5 has input/output characteristics of a gradient 1 which passes through an origin as shown in FIG. 2.

Figure 3:
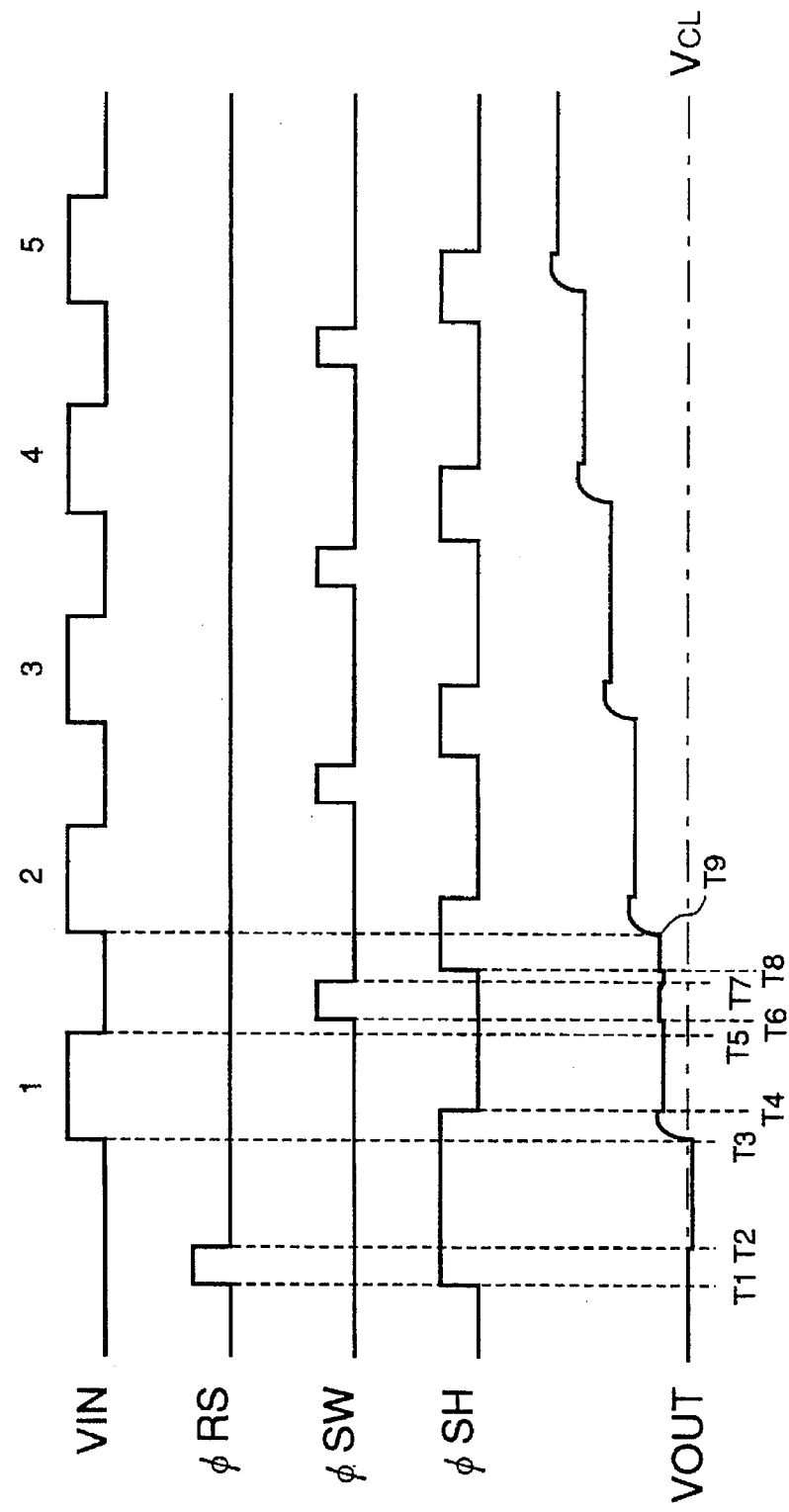
FIG. 3 is a timing chart for explaining the operation of the signal processing apparatus according to the embodiment 1.

The operation of the embodiment will now be simply explained with reference to a timing chart of FIG. 3.

First, when pulses $\phi_{RS}$ and $\phi_{SH}$ are set to the high level at time $T_1$, the MOS transistors 3 and 6 are turned on. A node 8 and the holding capacitor 2 are initialized by a voltage that is given to a terminal $V_{CL}$. At time $T_2$, the pulse $\phi_{RS}$ is set to the low level, the MOS transistor 3 is turned off, and the node 8 and holding capacitor 2 are set into a floating state.

At time $T_3$, when an input signal 1 rises, a potential of the holding capacitor 2 in the floating state is raised through the capacitor 1. A voltage increase width in this instance is expressed by $$\frac{C_1}{C_1 + C_2} V_{S1} \qquad (1.1)$$

$C_1$ ... capacitance value of the capacitor means 1
$C_2$ ... capacitance value of the holding capacitor
$V_{S1}$ ... voltage value of the signal 1

At time $T_4$, when the pulse $\phi_{SH}$ trails, the holding capacitor 2 is disconnected from the node 8. After that, even if the input signal trails at time $T_5$, the holding capacitor 2 is not influenced by the trailing of the input signal. On the other hand, the potential of the node 8 drops as the input voltage decreases.

At time $T_6$, when a pulse $\phi_{SW}$ is set to the high level, an output of the buffer 5 is connected to the node 8. The potentials at nodes 9 and 8 are equalized. When the pulse $\phi_{SW}$ is set to the low level at time $T_7$, the switching MOS transistor 4 is turned off and the node 8 is disconnected from the buffer 5. At time $T_8$, the pulse $\phi_{SH}$ is set to the high level and the sampling MOS transistor 6 is turned on. Further, at time $T_9$, when the next input signal 2 is given to the input terminal, the voltage of the holding capacitor 2 rises and is set to $$V_{CL} + \frac{C_1}{C_1 + C_2} (V_{S1} + V_{S2}) \quad (1.2)$$

$V_{S2}$ ... voltage value of the signal 2

The analog addition of the input signal can be realized. By repetitively executing the above operations, the following addition arithmetic operation can be realized.

$$\frac{C_1}{C_1 + C_2} \times \sum_{i=1}^{n} V_{Si} \quad (1.3)$$

As shown in the expression (1.3), it will be obviously understood that it is sufficient to set such that $C_1 \gg C_2$ in order to increase an addition gain.

In the first embodiment, the input signals have been Given by the time series such as (reference voltage)–(input signal 1)–(reference voltage)–(input signal 2) ... However, in the case where the input signals are given by a time series such as (reference voltage)–(output voltage (N1) at dark period for the first pixel)–(reference voltage)–(output voltage (S1) at light period for the first pixel)–(reference voltage)–(output voltage (N2) at dark period for the second pixel) ..., an arithmetic operation such as{(S1 signal)–(N1 signal)}+{(S2 signal)–(N2 signal)}+... can be also executed. Accordingly, it becomes possible to add the light signal component for each pixel.

Figure 4:
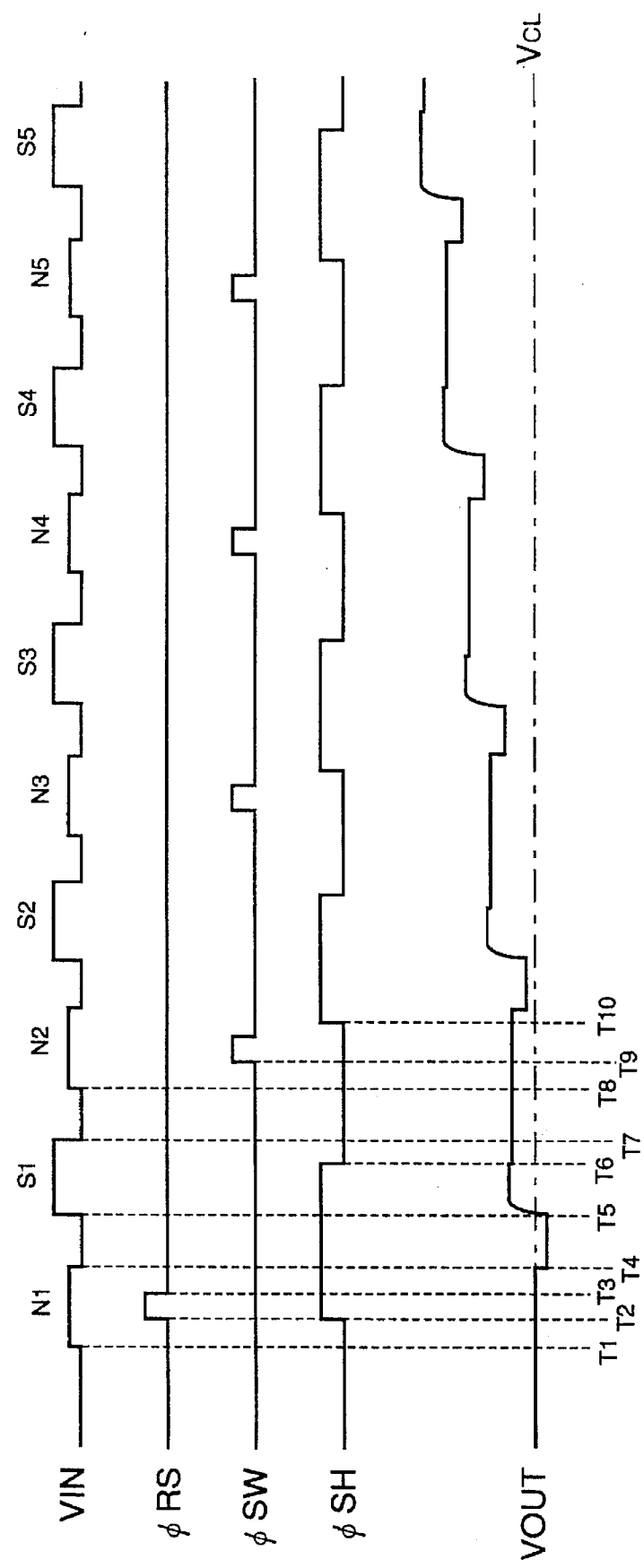
FIG. 4 is a timing chart for explaining the operation of a signal processing apparatus according to an embodiment 2 of the invention.

Explanation will now be simply made with reference to a timing chart of FIG. 4.

When the N1 signal is given to the input terminal at time $T_1$ and the pulses $\phi_{RS}$ and $\phi_{SH}$ are set to the high level at time $T_2$, the MOS transistors 3 and 6 are turned on and the holding capacitor is initialized to $V_{CL}$.

Subsequently, when the pulse $\phi_{RS}$ is set to the low level at time $T_3$ and the MOS transistor 3 is turned off, the holding capacitor 2 is set into a floating state. When the voltage of the input signal drops to a reference level at time $T_4$, the following voltage is obtained in the holding capacitor 2.

$$-\frac{C_1}{C_1 + C_2} V_{N1} \quad (2.1)$$

Further, when the S1 signal is given to the input terminal at time $T_5$, the following voltage is obtained in the holding capacitor 2.

Before the S1 signal trails, by applying the pulse $$\frac{C_1}{C_1 + C_2} (V_{S1} - V_{N1}) \quad (2.2)$$

$\phi_{SH}$ at the low level at time $T_6$ and turning off the MOS transistor 6, the potential of the holding capacitor 2 is not influenced by the trailing of the S1 signal at time $T_7$.

After the next N2 signal was input at time $T_8$, by applying the pulse $\phi_{SW}$ at the high level at time $T_9$ and turning on the MOS transistor 4, the potential at the node 8 is equalized to the potential of the holding capacitor 2 by the buffer 5.

By applying the pulse $\phi_{SW}$ at the low level, the MOS transistor 4 is turned off. After that, by applying the pulse $\phi_{SH}$ at the high level at time $T_{10}$, the MOS transistor 6 is turned on.

At this time point, the nodes 8 and 9 are set to the voltage given by the expression (2.2). When the N2 signal trails at time $T_{11}$ and the S2 signal rises at time $T_{12}$, the holding capacitor 2 is set to the voltage which is given by the following expression.

$$\frac{C_1}{C_1 + C_2} \{(V_{S1} - V_{N1}) + (V_{S2} - V_{N2})\} \quad (2.3)$$

When the MOS transistor 6 is turned off by applying the pulse $\phi_{SH}$ at the low level at time $T_{13}$, the potential of the holding capacitor 2 is held.

By repetitively executing the above operations, the following voltage can be obtained.

$$\frac{C_1}{C_1 + C_2} \left\{ \sum_{i=1}^{n} V_{Si} - \sum_{i=1}^{n} V_{Ni} \right\} \quad (2.4)$$

According to the embodiment, for example, in the case where the offset voltage of the input signal is large and the circuit is saturated at most a few times by adding the input signal as it is, the effective dynamic range is increased by inputting the offset voltage to the N signal, or in the case where the output signal of the photoelectric converting apparatus is used as an input signal of the circuit, by inputting an output voltage in a dark state as an N signal, the adding operation of only the photo signal components can be performed. Therefore, the embodiment is effective.

Figure 5:
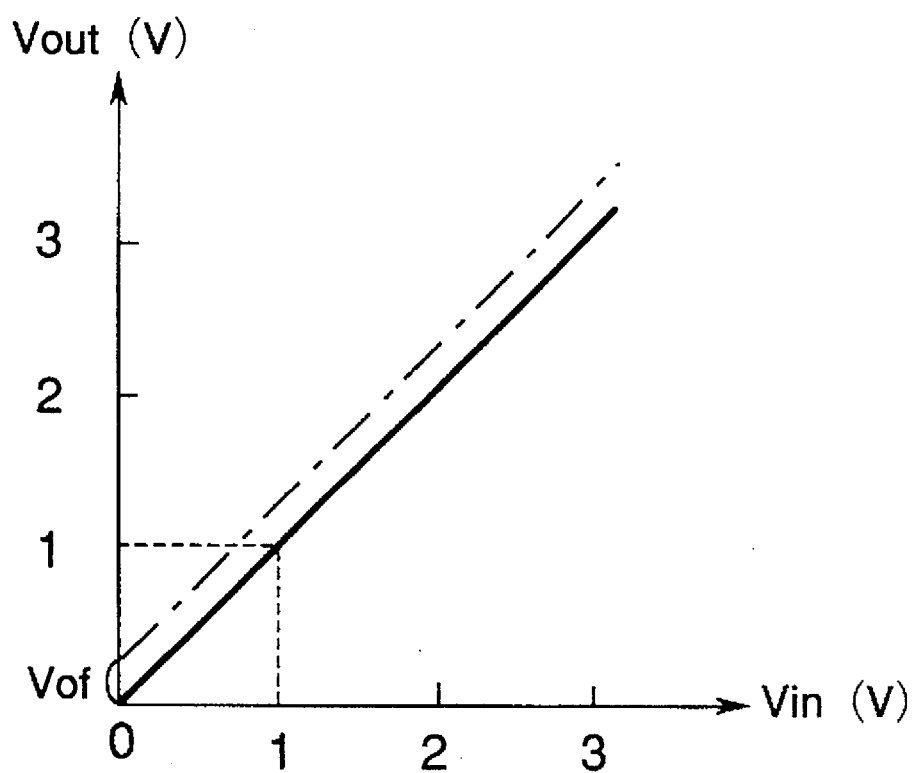
FIG. 5 is a graph showing another characteristics of a buffer circuit which is used in the invention.

The above embodiments have been described above on the assumption that the buffer 5 has ideal characteristics as shown in FIG. 2. However, there is actually a finite offset voltage $V_{of}$ as shown by an alternate long and short dash line in FIG. 5. In this case, according to the construction of FIG. 1, since the feedback by the buffer is executed every adding operation, the offset voltage is also summed up and its error increases as the number of addition times is large.

Figure 6:
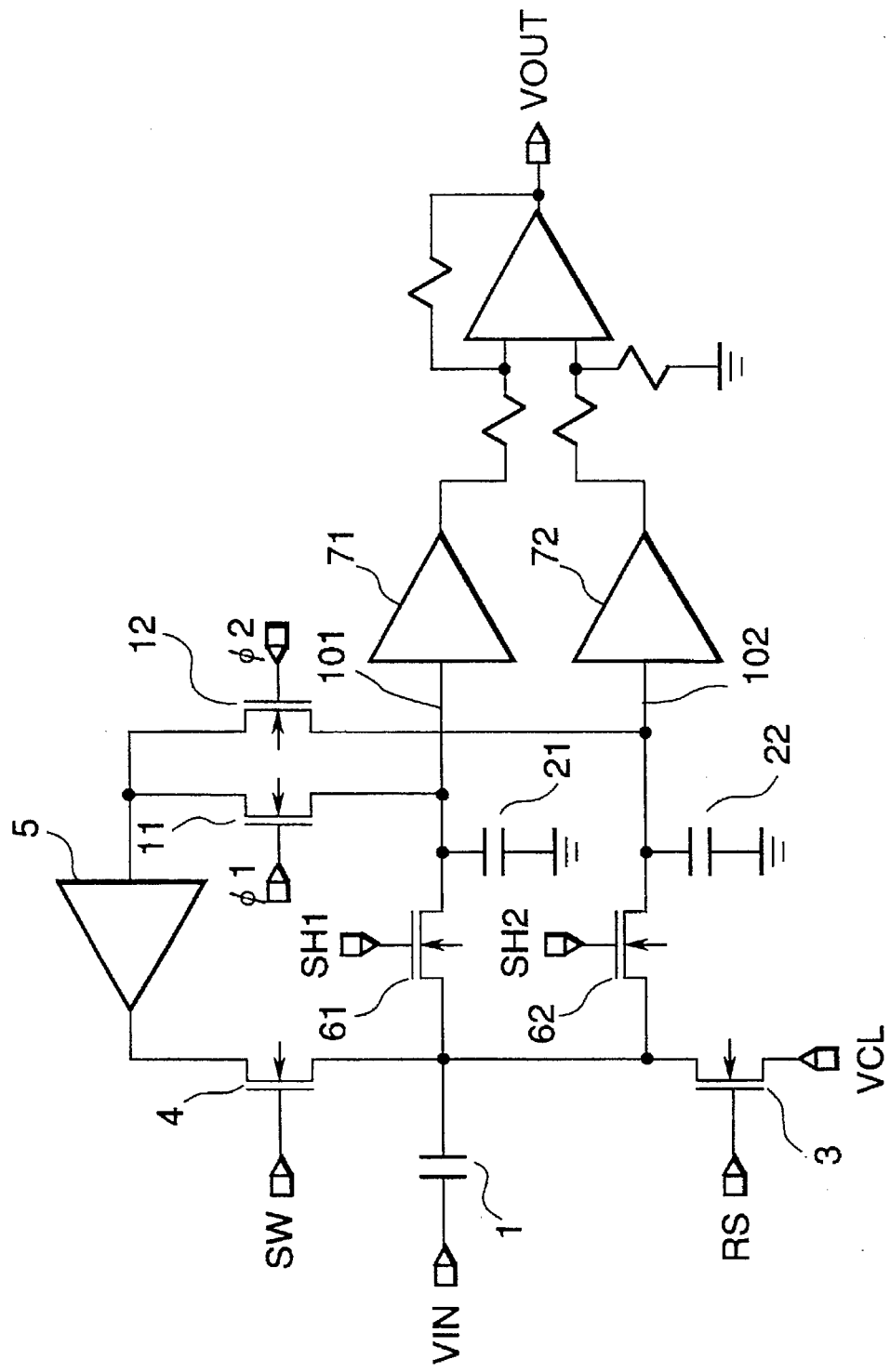
FIG. 6 is a circuit constructional diagram of a signal processing apparatus according to an embodiment 3 of the invention.

According to the embodiment, even in the case where there is an offset voltage in the buffer 5, the accurate adding operation can be performed. The embodiment has a construction as shown in FIG. 6.

The operation of the embodiment will be simply explained with reference to a timing chart of FIG. 7.

Figure 7:
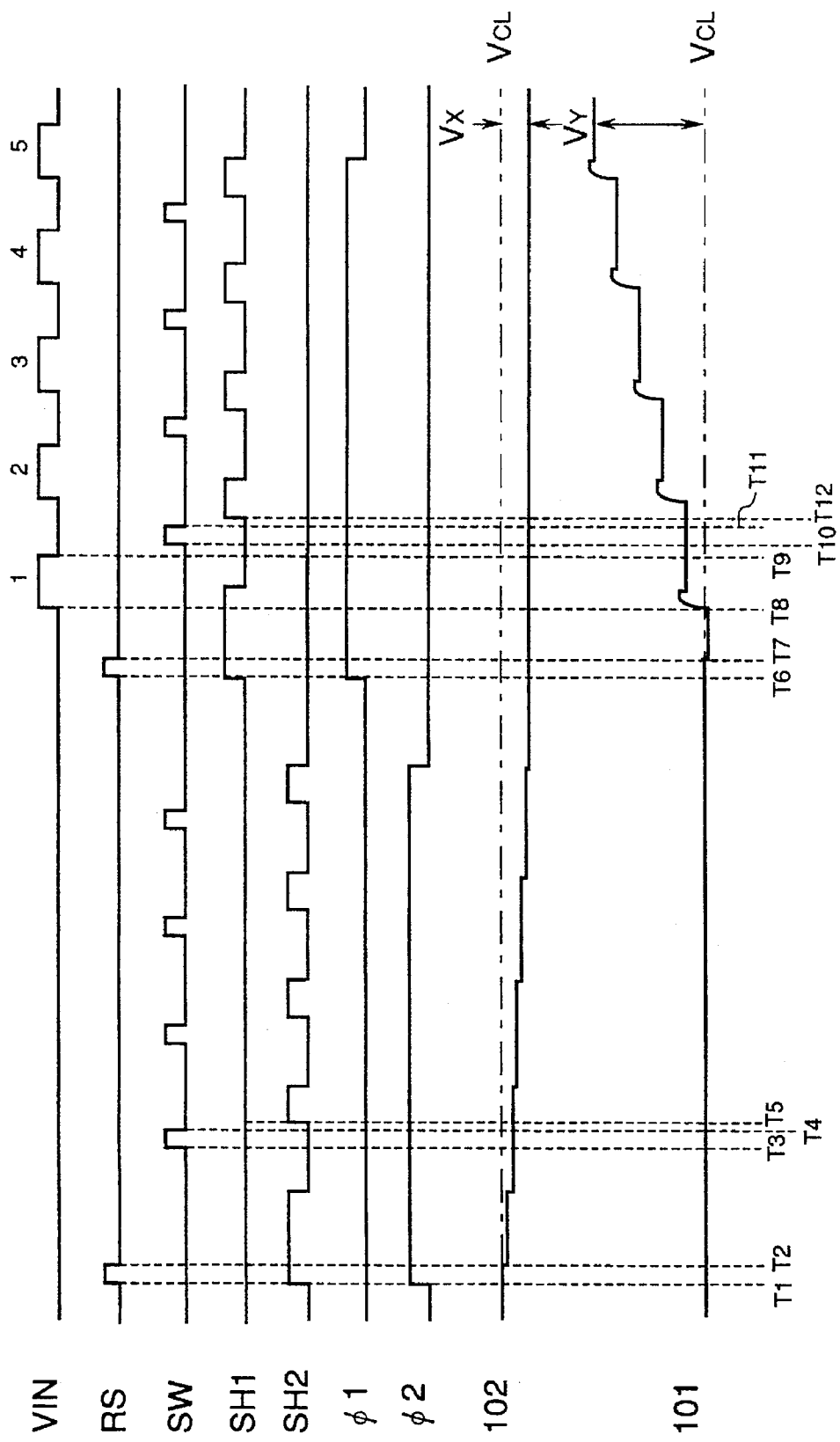
FIG. 7 is a timing chart for explaining the operation of the signal processing apparatus according to the embodiment 3.

In FIG. 7, five signals are input as input signals. First, a reference level is input to the input terminal for a period of time from time $T_1$ to $T_6$. For this period of time, by applying the pulse $\phi_1$ at the low level and the pulse $\phi_2$ at the high level, the MOS transistor 11 is turned off and the MOS transistor 12 is turned on, so that substantially the same operation as the operation shown in the embodiment 1 is executed. Therefore, the calculation error voltage corresponding to five operating times is held in the holding capacitor 22.

When five input signals are subsequently input after time $T_6$, the calculation result including the calculation errors as much as five operating times is held in the holding capacitor 21.

For this period of time, a pulse $\phi_1$ at low level and a pulse $\phi_2$ at high level are applied adding operation shown in the embodiment 1 is repeated five times. A system which operates in this instance comprises: the capacitor 1; a sampling MOS transistor 62; a holding capacitor 22; a switching means 12; the buffer 5; and the switching means 4. For this period of time, a pulse $\phi_1$ at the high level and a pulse $\phi_2$ at the low level are applied, so that an MOS transistor 11 is turned on and the MOS transistor 12 is turned off. A system which operates comprises: the capacitor 1; a sampling MOS transistor 61; a holding capacitor 21; the switching means 11; the buffer 5; and the switching means 4. After completion of the above operations, by executing a differential operation between the holding capacitors 21 and 22, the adding operation result having no error is derived.

In the embodiment, the period of time during which the addition of the offset voltage of the buffer 5 is executed and the period of time during which the addition of the signal is performed have completely been separated. It will be obviously understood that the period of time to add the signal itself and the period of time to add the offset voltage of the buffer can be alternately provided with respect to the signal addition of one time. In this case, even if the number of input signals is not previously known, the addition result without an error is derived.

Figure 8:
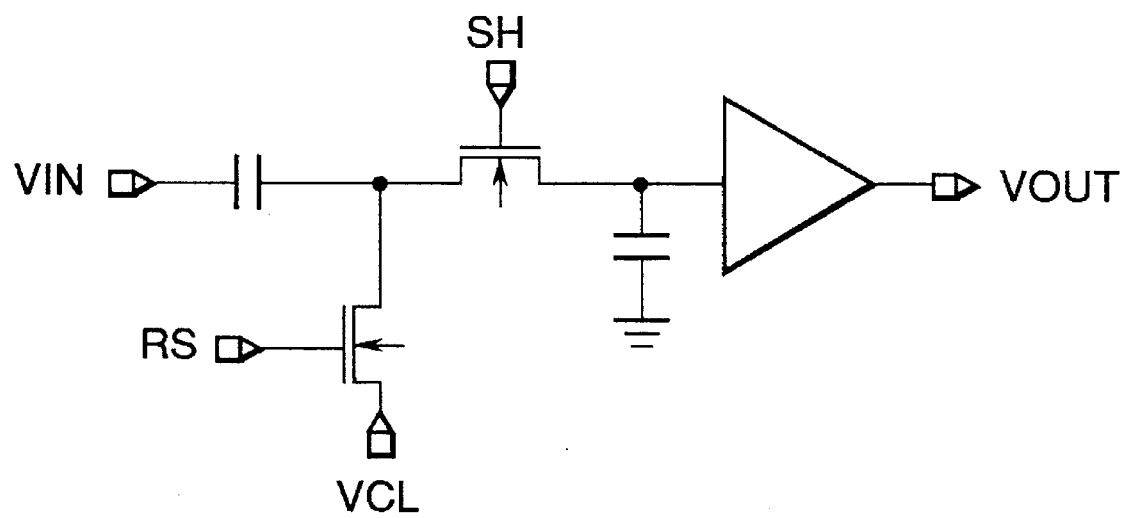
FIG. 8 is a circuit diagram of a conventional signal processing apparatus.
Figure 9:
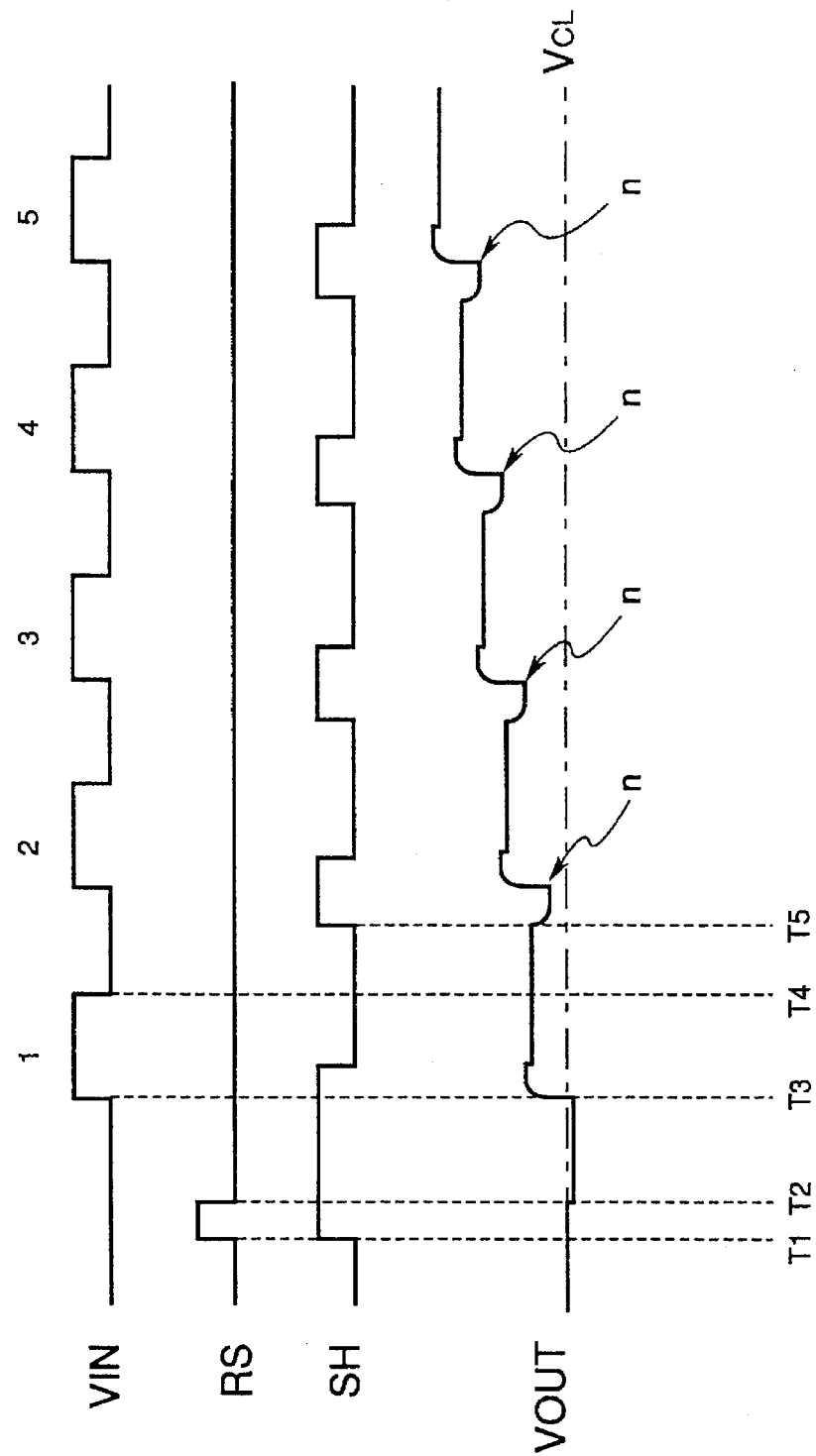
FIG. 9 is a timing chart for explaining the operation of the conventional signal processing apparatus.

FIGS. 8 and 9 relate to an example of a signal processing apparatus which is used for comparison with the present invention. As shown at timings $T_2$, $T_3$, and $T_5$, noises (n) due to the rising of the input signal $V_{IN}$ from a signal source appear. According to the invention, a signal in which such noises (n) are eliminated and an S/N ratio is high and a dynamic range is large can be obtained.

The explanation has been made with respect to a point that the adding operation of the analog signal is obtained by the following expression $$\frac{C_1}{C_1 + C_2} \times \sum_{i=1}^{n} V_{Si} \qquad (1.3)$$

in the construction of the embodiment 1. It has already mentioned that it is preferable to set such that $C_1 \gg C_2$ in order to increase the gain. However, when $C_1$ is increased, a chip size enlarges, resulting in an increase in costs. When $C_2$ is reduced to a parasitic capacitance level of the node 9, there is a possibility such that random noises such as noises due to clocks, thermal noises, or the like increase.

Figure 10:
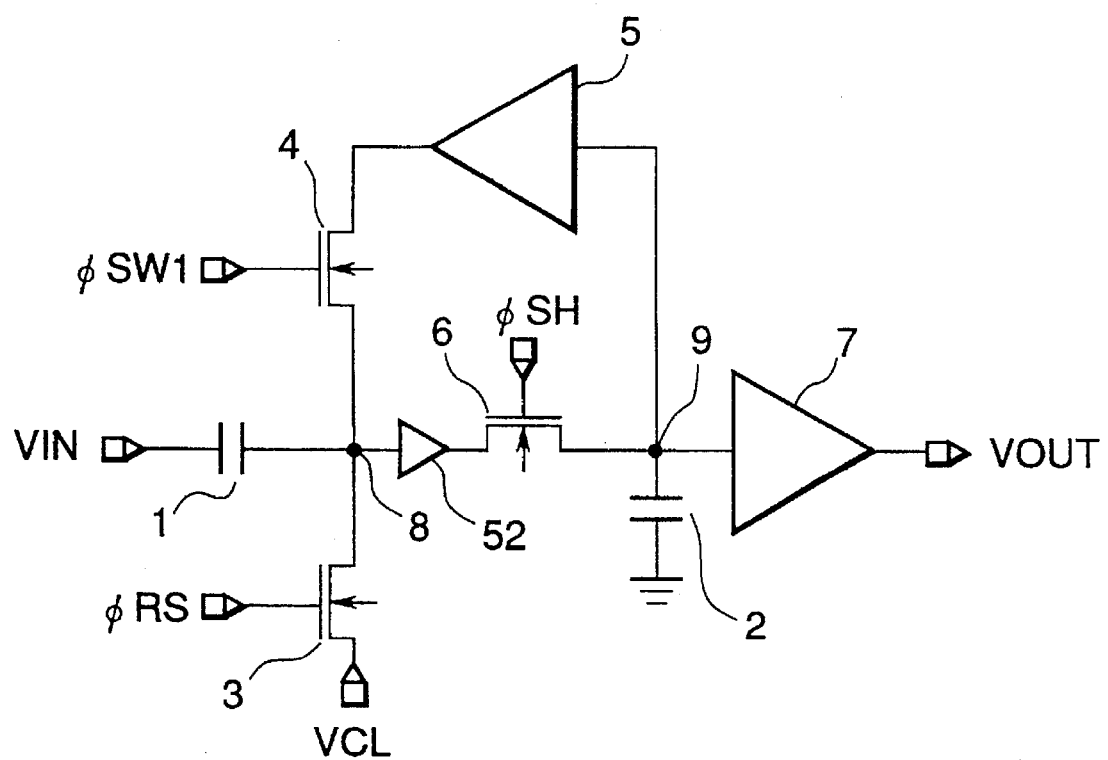
FIG. 10 is a circuit diagram of a signal processing apparatus according to an embodiment 4 of the invention.

The embodiment 4 is made to solve the above subject and has a construction as shown in FIG. 10. That is, buffer means 52 is provided before the sampling MOS transistor 6.

Figure 11:
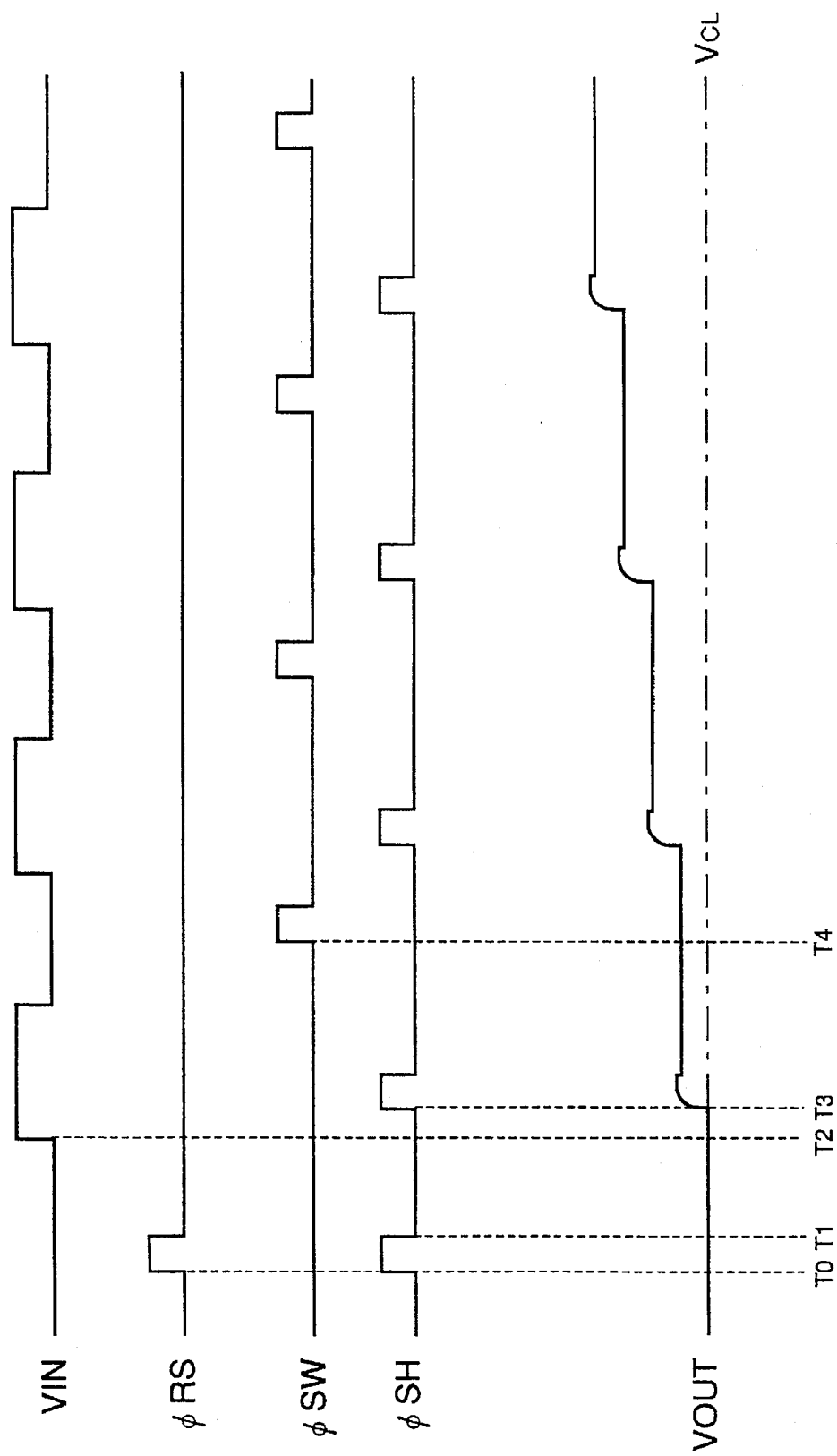
FIG. 11 is a timing chart for explaining the operation of the signal processing apparatus according to the embodiment 4.

The operation of the embodiment will now be simply explained hereinbelow with reference to a timing chart of FIG. 11.

First, by applying the pulses $\phi_{RS}$ and $\phi_{SH}$ at the high level for a period of time from time $T_0$ to $T_1$, the nodes 8 and 9 are initialized to $V_{CL}$. When the input signal 1 is input from the input terminal $V_{IN}$ at time $T_2$, the potential at the node 8 is increased by only the following level.

$$\frac{C_1}{C_1 + C_S} V_{S1} \qquad (4.1)$$

In this instance, by designing the capacitor $C_s$ so as to have a very small capacitance value, the potential at the node 8 can be set to the following value.

$$\frac{C_1}{C_1 + C_S} \simeq 1$$

By applying the pulse $\phi_{SH}$ at the high level at time $T_3$, the potential at the node 8 is written into the holding capacitor 2 by using the buffer 52. In this instance, it is necessary to set the input characteristics of the buffer 52 to the characteristics similar to those of the buffer 5.

After that, by reducing the pulse $\phi_{SH}$ to the low level, the sampling MOS transistor 6 is turned off. After that, the input signal trails and is not influenced even when the potential at the node 8 drops.

By applying the pulse $\phi_{SW}$ at the high level at time $T_4$, the MOS transistor 4 is turned on and the potential of the holding capacitor is written to the node 8. Further, when the input signal 2 is input after that, the addition result of the signals 1 and 2 is derived as follows.

$$\frac{C_1}{C_1 + C_S} (V_{S1} + V_{S2}) \qquad (4.2)$$

By repetitively executing the above operations, the following adding operation can be realized.

$$\frac{C_1}{C_1 + C_S} \sum_{i=1}^{n} V_{Si} \qquad (4.3)$$

According to the embodiment, an addition gain can be increased and the holding capacitance can be increased, so that a stable output can be obtained.

According to the invention, an adverse influence by the leading or trailing of the input signal is suppressed and substantially only the signal components can be added. The dynamic range can be increased and the S/N ratio can be improved.

Although the embodiments have been described above with respect to only the addition of the signals, it will be obviously understood that the subtraction can be also simply performed by using an analog inverter comprising an inversion amplifier or the like in the input section of the circuit.

Figure 12:
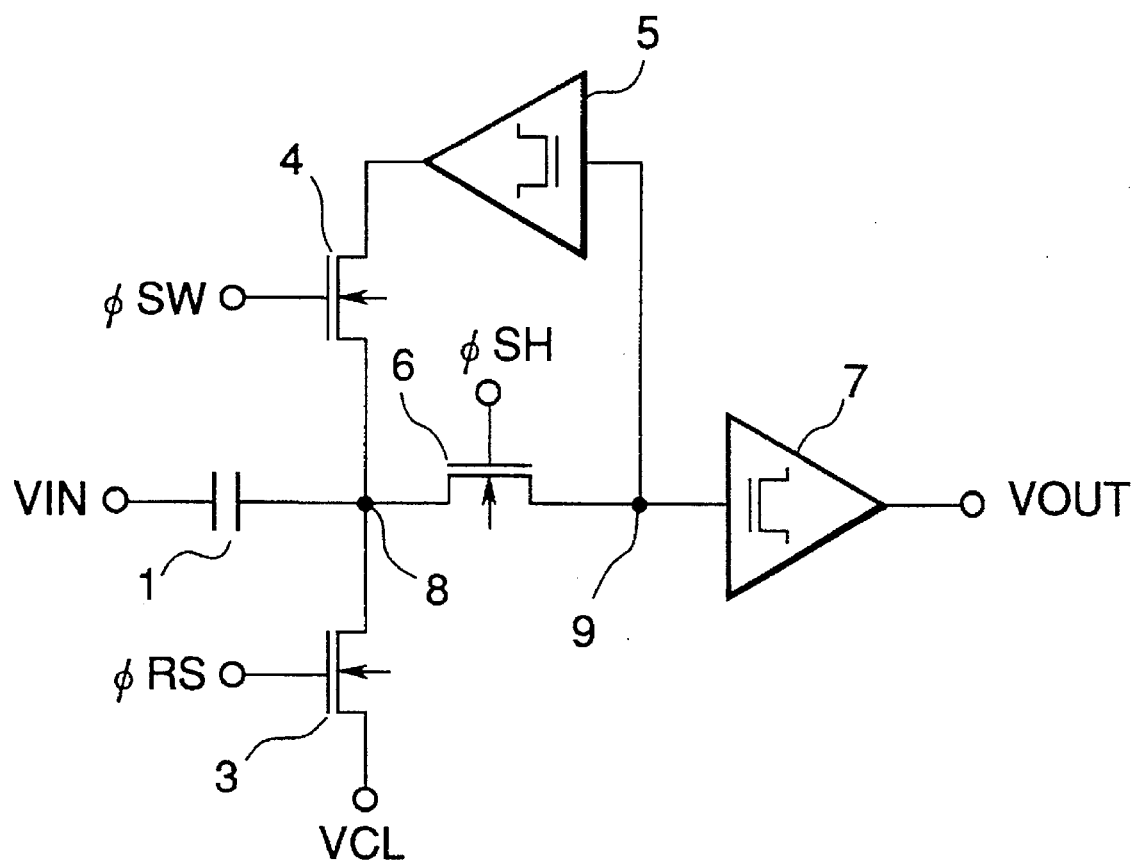
FIG. 12 is a circuit diagram to increase the circuit gain.

The connecting means which is provided between the coupling means and the hold means in the aforementioned embodiments is not necessarily required. In the aforementioned embodiments, the PN junction capacity or MOS capacity can serve as the holding (sampling) capacity. In addition, it is possible to use the input capacity of the succeeding output amplifier or input capacity of the feedback amplifier. In this case, since $C_2$ becomes small, the circuit gain will increase (see FIG. 12). In the aforementioned embodiments, the signal addition operation is explained. It, however, will be easily understood that the subtraction operation also can be realized.

Figure 13:
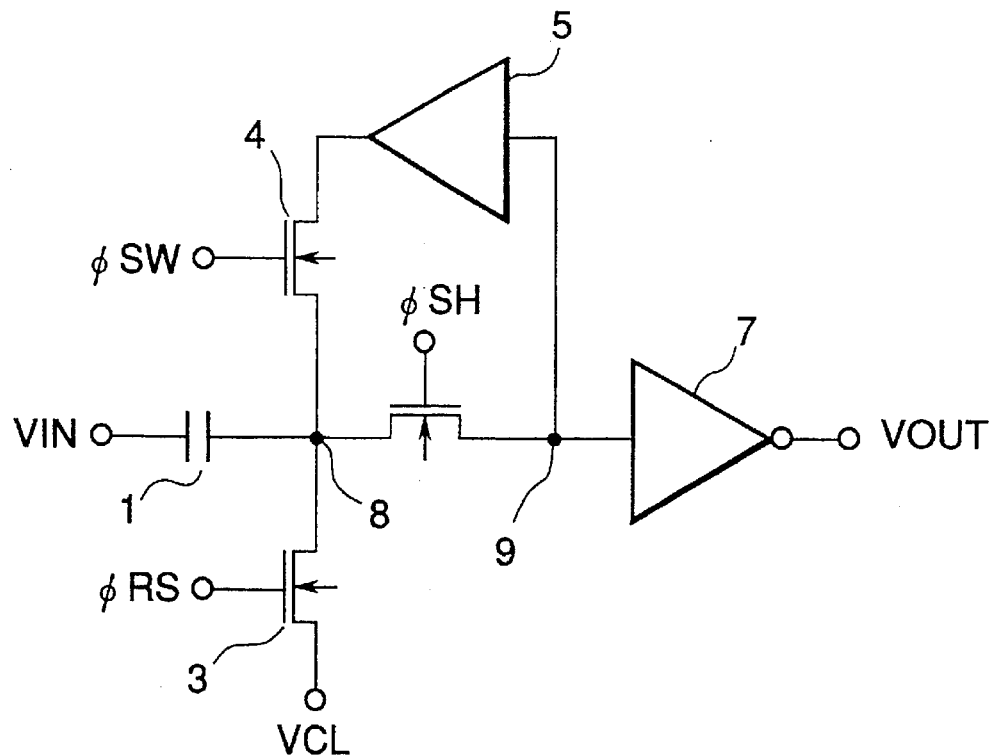
FIG. 13 is a circuit diagram of embodiment 5 for a signal processing apparatus according to the invention.
Figure 14:
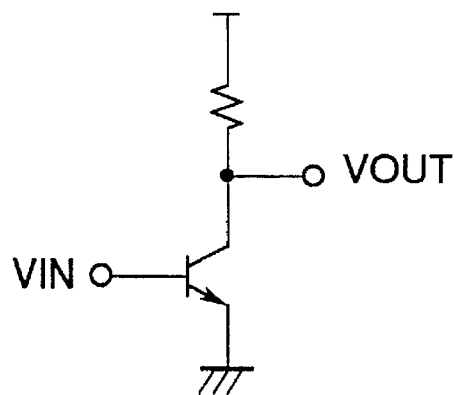
FIG. 14 is a circuit diagram of one example of an inverted type of amplifier used in the embodiment 5.

FIG. 13 illustrates the fifth embodiment according to the present invention. This embodiment is made by modifying the output amplifier of the first embodiment into an inverted type of amplifier. It will be easily understood that in this embodiment the signal subtraction can be realized with the same drive manner in the first embodiment. As the inverted type of amplifier, an emitter grounded amplifier of FIG. 14 can be used.

It should be noted that even in the first embodiment the subtraction operation can be realized by changing the pulse timing.

Figure 15:
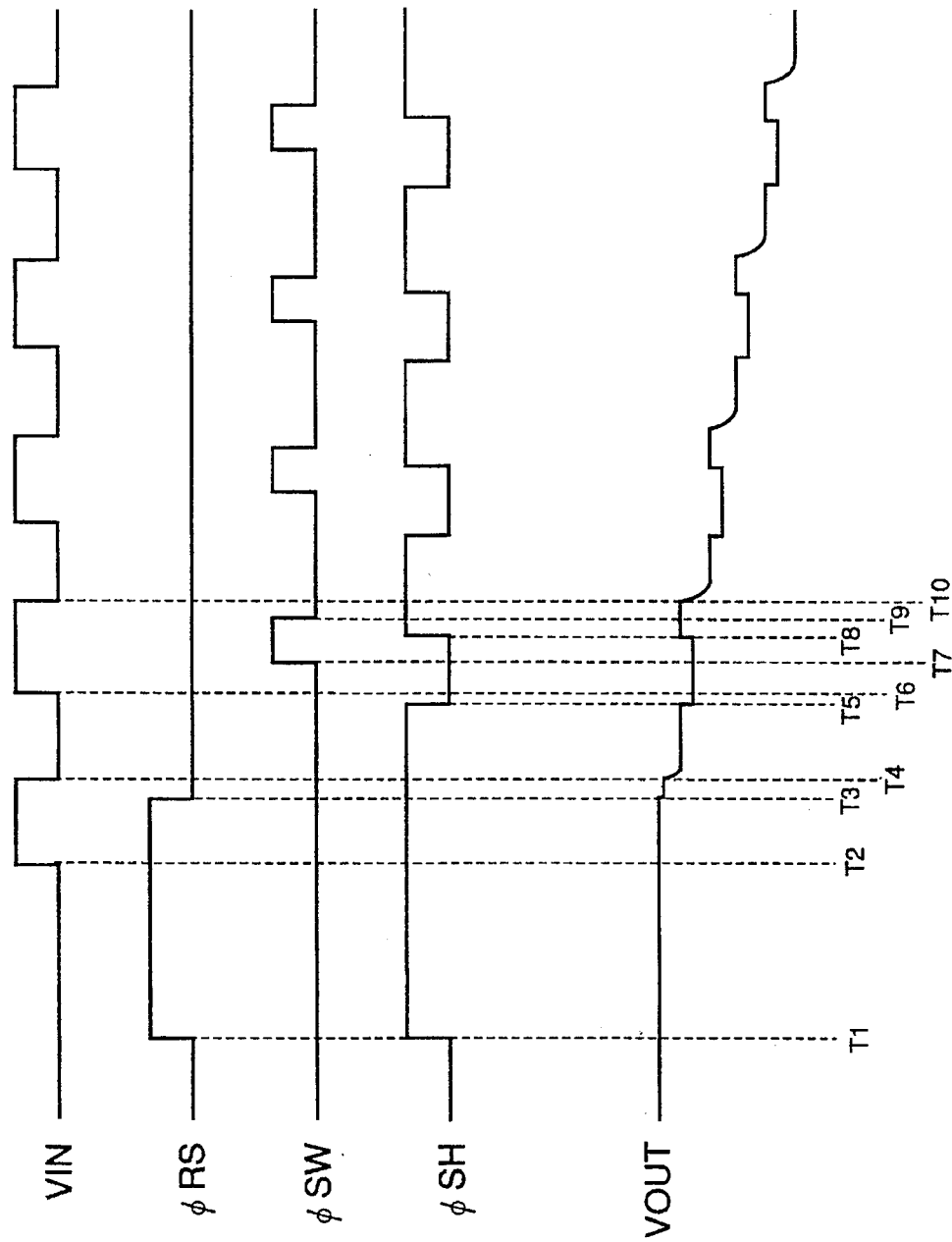
FIG. 15 is a timing chart for embodiment 6 for a signal processing apparatus according to the invention.

FIG. 15 shows the timing chart of the sixth embodiment. The circuit operation will be explained by referring to FIG. 15 and FIG. 1. When high level pulses are applied the signals $\phi_{RS}$ and $\phi_{SH}$, at time of $T_1$, MOS transistors 3 and 6 become ON state so that nodes 8 and 9 are initialized to voltage $V_{CL}$. At time of $T_2$ when the input signal rises, nodes 8 and 9 are still in the reset state. When signal $\phi_{RS}$ rises at time of $T_3$, MOS transistor 3 becomes OFF state while MOS transistor 9 is still in ON state and nodes 8 and 9 are conductive. When the input signal decays at time of $T_4$, nodes 8 and 9 swing downwardly through clamp capacitor 1. Afterthere, at time of $T_5$, signal $\phi_{SH}$ becomes LOW level, and MOS transistor 9 becomes OFF state so that the potential of node 9 is held. Even if the second pulse of the input signal is applied at time of $T_6$, node 9 is not affected because of the disconnection from the clamp capacitor. A high level pulse of signal $\phi_{SW}$ is applied at time of $T_7$, so that the potential of node 8 is made to be equal to that of node 9, subsequently a high level pulse of signal $\phi_{SH}$ is applied at time of $T_8$, so that nodes 8 and 9 become conductive. Thereafter, node 8 is made to be floated by raising the pulse of signal $\phi_{SW}$ at time of $T_9$. At time of $T_{10}$, as the input signal rises, node 9 is swung downwardly. As a result, in the same way of the embodiment 1, the following relation can be obtained.

$$V_{CL} - \frac{C_1}{C_1+C_2}(V_{S1}+V_{S2})$$

By repeating the above operation for the necessary times, the following subtraction can be realized.

$$-\frac{C_1}{C_1+C_2} \times \sum_{i=1}^{n} V_{Si}$$

As another way, it will be easily understood that the subtraction can be made by inverting the input signal itself. In addition, it should be noted that a plurality of input terminals can be provided.

Figure 16:
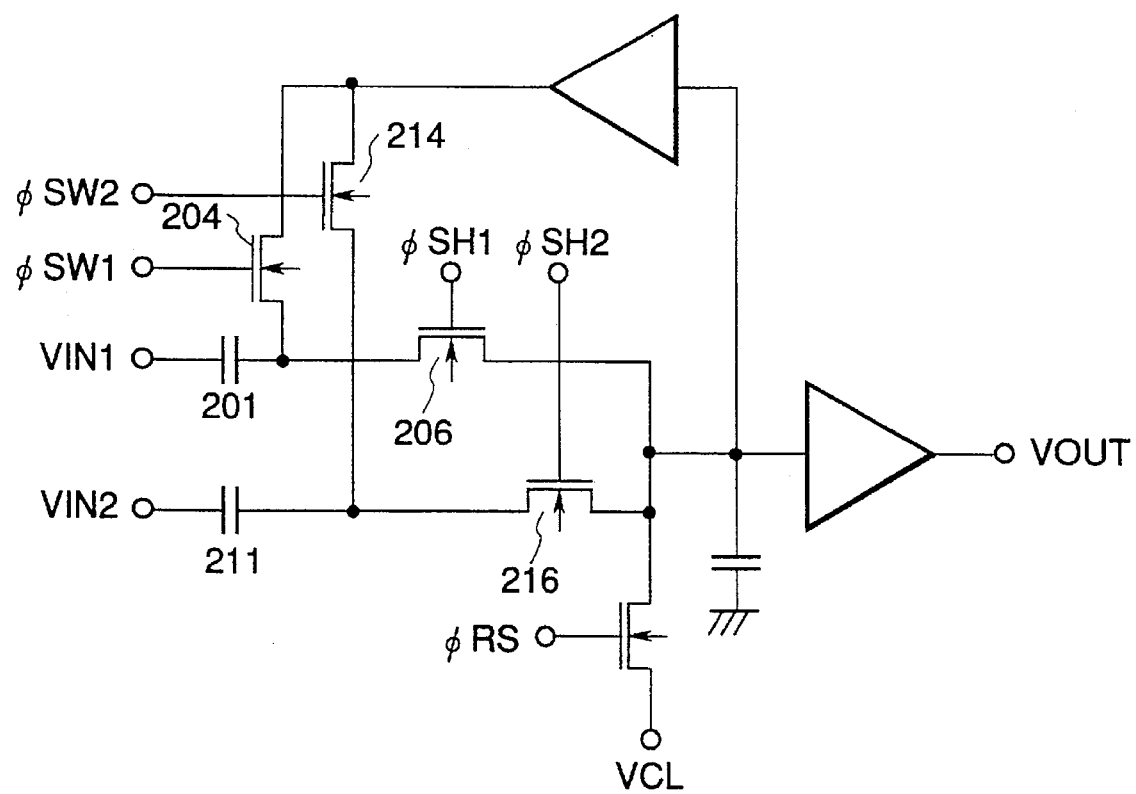
FIG. 16 is a circuit diagram of embodiment 7 for a signal processing apparatus according to the invention.

FIG. 16 illustrates the seventh embodiment according to the present invention. In this embodiment, with two input terminals $V_{IN1}$ and $V_{IN2}$, there are respectively provided clamp capacitors 201 and 211, sample hold switches 206 and 216 and feedback switches 204 and 214. The operation is the same as that of the first embodiment. The operation can be performed simultaneously for two lines or time-divisionary for two lines.

When clamp capacitors 201 and 211 have different values from each other, it is possible to give different weightings onto the respective input from $V_{IN1}$ and $V_{IN2}$. In addition, the addition and subtraction can be made at the same time or in a time-division manner by connecting the output from an inverted type of amplifier to $V_{IN1}$ or $V_{IN2}$.

Further, according to the invention, since the analog signal process can be performed by a very simple circuit of a small scale, the circuit can be easily constructed on the same chip as a peripheral circuit of various kinds of sensing chips. An IC of a high performance can be realized by low costs.

The invention has an application field as an analog signal adding/subtracting apparatus. Hitherto, in case of repetitively performing the addition or subtraction of the signals, after the signals were once A/D converted into the digital signals, the digital signals are added in many cases. According to the invention, however, since the addition or subtraction can be executed by using analog amounts, a remarkably high processing speed can be realized.

The invention also has an application field as a signal processing apparatus of output signals from all of the photoelectric converting devices such as CCDs or the like. For example, in an area sensor, by spatially adding the signals of the pixels, an exposure amount of the sensor surface can be known (application field as an AE).

In the area sensor, by adding the signals of the pixels on a row or column unit basis, two-dimensional information can be compressed into one-dimensional projection information. A simple pattern matching can be executed by using such one-dimensional projection information.

Further, by adding the signals from photosensors with respect to the time, even a microsignal can be accurately read out.

On the other hand, by adding the microsignals from various kinds of sensors to detect pressures, temperatures, or the like with respect to the time or space, the invention can be also applied as a detector.

In addition, by adding the signals from different sensors to detect pressures, temperatures, humidities, or the like (by weighing as necessary), complicated controls of the apparatus can be performed. For example, in an air conditioner, a fine control such that, when a temperature is equal to 28° C. and a humidity is equal to 80%, a cooling operation which preferentially performs a dry mode is set can be performed. The invention can be also suitably applied to a control of a robot or the like.

What is claimed is:

1. A signal processing apparatus comprising:
   signal holding means for holding an input signal from a signal source;
   coupling means provided on the signal source side;
   connecting means for connecting said coupling means and said signal holding means; and
   amplifying means provided across said connecting means through switching means,
   wherein an output terminal of said amplifying means is connected to the side of said coupling means.

2. An apparatus according to claim 1, wherein an input terminal of said amplifying means is connected to the side of said signal holding means.

3. An apparatus according to claim 1, wherein said signal holding means includes a capacitor.

4. An apparatus according to claim 1, wherein said switching means is provided at the output side of said amplyfing means.

5. An apparatus according to claim 1, wherein said connecting means includes a switch.

6. An apparatus according to claim 5, wherein said switch includes an MOS transistor.

7. An apparatus according to claim 1, wherein said coupling means includes a capacitor.

8. An apparatus according to claim 1, further having a buffer amplifier connected to said signal holding means.

9. An apparatus according to claim 1, further having a buffer between said coupling means and said connecting means.

10. An apparatus according to claim 1, further having second connecting means for selectively connecting said coupling means to a predetermined potential.

11. A signal processing apparatus comprising:
    signal holding means for holding an input signal from a signal source;
    coupling means provided on the signal source side;
    connecting means for connecting said coupling means and said signal holding means;
    amplifying means provided across said connecting means; through switching means; and
    a buffer amplifier connected to said signal holding means;
    wherein an input terminal of said amplifying means is connected to the side of said signal holding means.

12. A signal processing apparatus comprising:
    signal holding means for holding an input signal from a signal source;
    coupling means provided on the signal source side;
    connecting means for connecting said coupling means and said signal holding means;
    amplifying means provided across said connecting means through switching means; and
    a buffer amplifier connected to said signal holding means,
    wherein an output terminal of said amplifying means is connected to the side of said coupling means.

13. An apparatus according to claim 11, wherein said signal holding means includes a capacitor.

14. An apparatus according to claim 11, wherein said switching means is provided at the output side of said amplifying means.

15. A apparatus according to claim 11, wherein said connecting means includes a switch.

16. An apparatus according to claim 15, wherein said switch includes an MOS transistor.

17. An apparatus according to claim 11, wherein said coupling means includes a capacitor.

18. An apparatus according to claim 11, further having a buffer between said coupling means and said connecting means.

19. An apparatus according to claim 11, further having second connecting means for selectively connecting said coupling means to a predetermined potential.

20. A signal processing apparatus comprising:

signal holding means for holding an input signal from a signal source;

coupling means provided on the signal source side;

connecting means for connecting said coupling means and said signal holding means;

amplifying means provided across said connecting means through switching means; and a buffer between said coupling means and said connecting means, wherein an input terminal of said amplifying means is connected to the side of said signal holding means.

21. A signal processing apparatus comprising:

signal holding means for holding an input signal from a signal source;

coupling means provided on the signal source side;

connecting means for connecting said coupling means and said signal holding means;

amplifying means provided across said connecting means through switching means; and a buffer between said coupling means and said connecting means, wherein an output terminal of said amplifying means is connected to the side of said coupling means.

22. An apparatus according to claim 20, wherein said signal holding means includes a capacitor.

23. An apparatus according to claim 20, wherein said switching means is provided at the output side of said amplifying means.

24. An apparatus according to claim 20, wherein said connecting means includes a switch.

25. An apparatus according to claim 24, wherein said switch includes an MOS transistor.

26. An apparatus according to claim 20, wherein said coupling means includes a capacitor.

27. An apparatus according to claim 20, further having a buffer amplifier connected to said signal holding means.

28. An apparatus according to claim 20, further having second connecting means for selectively connecting said coupling means to a predetermined potential.

29. A signal processing apparatus comprising:

signal holding means for holding an input signal from a signal source;

coupling means provided on the signal source side;

first connecting means for connecting said coupling means and said signal holding means;

second connecting means for selectively connecting said coupling means to a predetermined potential; and amplifying means provided across said first connecting means through switching means, wherein an input terminal of said amplifying means is connected to the side of said signal holding means.

30. A signal processing apparatus comprising:

signal holding means for holding an input signal from a signal source;

coupling means provided on the signal source side;

first connecting means for connecting said coupling means and said signal holding means;

second connecting means for selectively connecting said coupling means to a predetermined potential; and amplifying means provided across said first connecting means through switching means, wherein an output terminal of said amplifying means is connected to the side of said coupling means.

31. An apparatus according to claim 29, wherein said signal holding means includes a capacitor.

32. An apparatus according to claim 29, wherein said switching means is provided at the output side of said amplifying means.

33. An apparatus according to claim 29, wherein said first connecting means includes a switch.

34. An apparatus according to claim 33, wherein said switching includes an MOS transistor.

35. An apparatus according to claim 29, wherein said coupling means includes a capacitor.

36. An apparatus according to claim 29, further having a buffer amplifier connected to said signal holding means.

37. An apparatus according to claim 29, further having a buffer between said coupling means and said connecting means.

* * * * *

UNITED STATES PATENT AND TRADEMARK OFFICE
CERTIFICATE OF CORRECTION

PATENT NO. : 5,659,497
DATED : August 19, 1997
INVENTOR(S) : Ueno et al.

It is certified that error appears in the above-identified patent and that said Letters Patent is hereby corrected as shown below:

Col. 1, line 29, delete "us" and inset -- is --.

Col. 3, line 22, delete "Given" and insert -- given --.

Signed and Sealed this

Seventeenth Day of March, 1998

BRUCE LEHMAN

*Attest:*

*Attesting Officer*     *Commissioner of Patents and Trademarks*